United States Patent [19]
Watabe et al.

[11] Patent Number: 5,631,475
[45] Date of Patent: May 20, 1997

[54] SEMICONDUCTOR LIGHT EMITTING ELEMENT

[75] Inventors: Shinichi Watabe; Hiroaki Okagawa, both of Itami; Takayuki Hashimoto, Kuga; Kazuyuki Tadatomo, Itami, all of Japan

[73] Assignee: Mitsubishi Cable Industries, Ltd., Hyogo, Japan

[21] Appl. No.: 498,752

[22] Filed: Jul. 6, 1995

[30] Foreign Application Priority Data

Jul. 8, 1994 [JP] Japan .................. 6-157279

[51] Int. Cl.⁶ ............................................. H01L 33/00
[52] U.S. Cl. .................... 257/94; 257/95; 257/96; 257/97; 257/103; 257/99
[58] Field of Search ....................... 257/90, 94, 96, 257/97, 95, 103, 99; 372/44, 45, 46

[56] References Cited

U.S. PATENT DOCUMENTS

| | | | |
|---|---|---|---|
| 4,897,846 | 1/1990 | Yoshida et al. | 257/94 X |
| 5,278,857 | 1/1994 | Yuge et al. | 257/97 X |
| 5,410,159 | 4/1995 | Sugawara et al. | 257/97 X |
| 5,466,950 | 11/1995 | Sugawara et al. | 257/97 X |
| 5,481,122 | 1/1996 | Jou et al. | 257/97 X |

FOREIGN PATENT DOCUMENTS

| | | | |
|---|---|---|---|
| 0434233 | 6/1991 | European Pat. Off. . | |
| 0616377 | 9/1994 | European Pat. Off. . | |
| 4017632 | 12/1990 | Germany . | |
| 9319416 | 5/1994 | Germany . | |
| 3171679 | 7/1991 | Japan | 257/97 |
| 3283676 | 12/1991 | Japan | 257/96 |
| 4229665 | 8/1992 | Japan | 257/97 |

*Primary Examiner*—William Mintel
*Attorney, Agent, or Firm*—Sughrue, Mion, Zinn, Macpeak & Seas

[57] ABSTRACT

A semiconductor light emitting element comprising a light emitting part comprising an AlGaInP active layer and a AlGaInP cladding layer, which is formed on a GaAs substrate, and an AlGaAs layer and a $Ga_xIn_{1-x}P$ layer ($0.7 \leq x \leq 1.0$) deposited in this order on said light emitting part, wherein said $Ga_xIn_{1-x}P$ layer has a thickness of not more than 1.0 μm. According to the present invention, absorption of the emitted light by an electrode contact layer and the occurrence of an interfacial distortion between the electrode contact layer and the layer thereunder can be suppressed, and a semiconductor light emitting element permitting easy production thereof and having a high luminance and a long service life can be provided.

9 Claims, 2 Drawing Sheets

SEMICONDUCTOR LIGHT EMITTING ELEMENT

FIELD OF THE INVENTION

The present invention relates to a semiconductor light emitting element such as a light emitting diode (hereinafter referred to as an LED). More particularly, the present invention relates to an AlGaInP semiconductor light emitting element having a high luminance and a long service life.

BACKGROUND OF THE INVENTION

There has been conventionally known an AlGaInP light emitting element as shown in FIG. 3. In the light emitting element H101 shown in said Figure, a light emitting part A101 having a double heterostructure wherein an n-type AlGaInP cladding layer 102, an AlGaInP active layer 103 and a p-type AlGaInP cladding layer 104 are sequentially laminated, is formed on an n-type GaAs substrate 101, and an electrode contact layer 107 is formed via a p-type AlGaAs protecting layer 106 on said light emitting part A101. A GaAs layer permitting easy formation of an ohmic contact is used as the electrode contact layer 107.

The above-mentioned structure of the semiconductor light emitting element H101 is advantageous in that occurrence of distortion due to different lattice constants is less, whereas the light emitted from the active layer 103 is absorbed by the uppermost GaAs layer 107 having a band gap of 1.42 eV. Therefore, the absorption of the light is suppressed by removing portions of the layer 107 other than the part right beneath the electrode by selective etching.

The etching of the GaAs layer 107 in the above-mentioned light emitting element H101 increases manufacture steps and production costs. In addition, the portion without the GaAs layer 107 becomes easily oxidized, since the AlGaAs layer 106 is exposed, thus causing problems in terms of moisture resistance. For overcoming this problem, a moisture-resistant layer needs to be formed separately, which increases steps and cost.

On the other hand, an AlGaInP light emitting element structure comprising an electrode contact layer 207 which does not require removing by etching, as shown in FIG. 4, has also been known. The light emitting element H201 shown therein comprises a p-type GaP contact layer 207 formed as an electrode contact layer on a light emitting part A201 having the same double heterostructure as the light emitting part A101 shown in the above-mentioned FIG. 3.

This light emitting element structure, however, is subject to occurrence of interfacial distortion between the GaP layer 207 and the AlGaInP cladding layer 204 thereunder, due to the different lattice constants and coefficients of thermal expansion of these layers. Specifically, the GaP layer 207 generally formed in the thickness of about 10 μm shows greater distortion, causing a load applied to the light emitting part A201, and said load lowers light emission efficiency and shortens service life. This problem becomes prominent with increasing thickness of the GaP layer 207.

SUMMARY OF THE INVENTION

It is therefore an object of the present invention to solve the above-mentioned problems and to provide a semiconductor light emitting element having a high luminance and a long service life, which allows suppression of the absorption of the emitted light by an electrode contact layer, the occurrence of interfacial distortion between an electrode contact layer and the layer thereunder, and easy production thereof.

The above-mentioned objects can be achieved by the present invention described in the following.

The semiconductor light emitting element of the present invention comprises a light emitting part comprising an AlGaInP active layer and an AlGaInP cladding layer, which is formed on a GaAs substrate, and an AlGaAs layer and a $Ga_xIn_{1-x}P$ layer ($0.7 \leq x \leq 1.0$) deposited in this order on said light emitting part, wherein said $Ga_xIn_{1-x}P$ layer has a thickness of not more than 1.0 μm.

According to the above-mentioned semiconductor light emitting element, an AlGaAs layer and a $Ga_xIn_{1-x}P$ contact layer ($0.7 \leq x \leq 1.0$) are deposited in this order on the light emitting part comprising an AlGaInP active layer and an AlGaInP cladding layer, wherein the AlGaAs layer functions as a buffer layer to relax the distortion caused by the different lattice constants and coefficients of thermal expansion between the $Ga_xIn_{1-x}P$ contact layer and the light emitting part and to reduce the load applied to the light emitting part.

Moreover, the thin $Ga_xIn_{1-x}P$ contact layer having a thickness of not more than 1.0 μm reduces the absolute amount of the interfacial distortion between the contact layer and the AlGaAs layer, thereby reducing the load on the light emitting part.

In addition, the use of a $Ga_xIn_{1-x}P$ layer which absorbs less emitted light, as an electrode contact layer, obviates removing of the contact layer by etching, which is necessary in the GaAs contact layer.

DETAILED DESCRIPTION OF THE INVENTION

Figure 1:
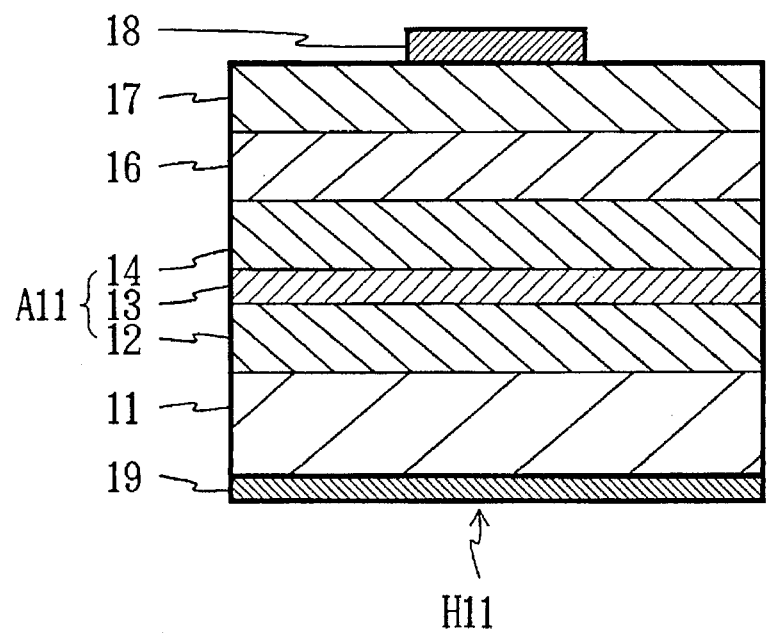
FIG. 1 is a sectional view of a light emitting diode showing one embodiment of the semiconductor light emitting element of the present invention.

The present invention is described in more detail by referring to the drawings showing the embodiments of the present invention, Fig, 1 is a sectional view showing one embodiment of the semiconductor light emitting element of the present invention. In the description to follow, the respective layers are to be considered to have a specific conductive type, which is not, however, limitative, and an n-type semiconductor layer can be a p-type semiconductor layer and vice versa.

In the Figure, H11 is a light emitting element, wherein an n-type AlGaInP cladding layer 12, an AlGaInP active layer 13 and a p-type AlGaInP cladding layer 14 are sequentially deposited on an n-type GaAs substrate 11 in this order to form a light emitting part A11, and a p-type AlGaAs layer 16 and a p-type $Ga_xIn_{1-x}P$ layer ($0.7 \leq x \leq 1.0$) 17 are deposited in this order on said light emitting part A11.

In this light emitting element H11, the light emitting part A11 has a double heterostructure wherein the n-type AlGaInP cladding layer 12 and the p-type AlGaInP cladding layer 14 are respectively formed on the lower and upper sides of the AlGaInP active layer 13. In addition, a dot-shaped upper electrode 18 is formed on the light output surface of a p-type $Ga_xIn_{1-x}P$ contact layer 17, and a plateshaped lower electrode 19 is formed under the n-type GaAs substrate 11 which is located opposite from the contact layer 17.

The GaAs substrate 11 may be a conventionally known n-type or p-type substrate.

For forming the above-mentioned AlGaInP active layer 13, AlGaInP mixed crystal materials which can form an active layer, such as $(Al_yGa_{1-y})_xIn_{1-x}P$ ($0 \leq x \leq 1$, $0 \leq y \leq 1$) are used. Specific examples are $(Al_{0.3}Ga_{0.7})_{0.5}In_{0.5}P$ and $Ga_{0.5}In_{0.5}P$.

The active layer 13 is grown on a substrate by a method known per se with or without a dopant added to the above-mentioned semiconductor material. Addition of a dopant is not desirable from the aspect of crystallinity. Considering the luminance, the thickness of the active layer 13 is appropriately about 0.5–2.0 μm.

The n-type AlGaInP cladding layer 12 and the p-type AlGaInP cladding layer 14 to be formed on the both sides of the above-mentioned active layer 13 are formed from an AlGaInP mixed crystal material which can form a cladding layer, such as $(Al_yGa_{1-y})_xIn_{1-x}P$ ($0 \leq x \leq 1$, $0 \leq y \leq 1$). Specifically exemplified are $(Al_{0.7}Ga_{0.3})_{0.5}In_{0.5}P$ and $Al_{0.5}In_{0.5}P$. These cladding layers 12 and 14 are formed by a method known per se upon addition of a dopant to the above-mentioned semiconductor material.

In these cladding layers, Se or Si is generally used as a dopant for the n-type layer and Zn or Mg is used as a dopant for the p-type layer, which layers are formed to have a thickness of about 0.2–2.0 μm.

In the semiconductor light emitting element of the present invention, it is essential that a p-type AlGaAs layer 16 and a p-type $Ga_xIn_{1-x}P$ layer 17 be deposited in this order on the above-mentioned light emitting part A11.

Materials for forming the AlGaAs layer 16 are AlGaAs semiconductor materials conventionally known, which are exemplified by $Al_{0.8}Ga_{0.2}As$ and $Al_{0.7}Ga_{0.3}As$. The AlGaAs layer 16 is formed to have a thickness of, for example, about 3–20 μm, preferably 5–10 μm by the crystal growth of the material added with a dopant, on the above-mentioned p-type AlGaInP cladding layer 14. When the thickness of the AlGaAs layer 16 is not less than 3 μm, sufficient luminance of the emitted light can be obtained and when it is not more than 20 μm, the luminance does not reach saturation.

The AlGaAs layer 16 is formed to have a different conductive type from the conductive type of the substrate 11, which is achieved by using a suitable dopant for this end. The dopant is generally Se or Si for an n-type layer and Zn or Mg for a p-type layer.

Of the GaInP materials which can form a contact layer, the semiconductor material for forming the $Ga_xIn_{1-x}P$ contact layer 17 is generally $Ga_xIn_{1-x}P$ ($0.7 \leq x \leq 1.0$). For example, $Ga_{0.7}In_{0.3}P$, $Ga_{0.8}In_{0.2}P$, $Ga_{0.9}In_{0.1}P$ and GaP are used, with preference given to GaP having a wide band gap and a small absorption of the light.

The $Ga_xIn_{1-x}P$ contact layer 17 is formed by the crystal growth on the above-mentioned AlGaAs layer 16 using a dopant which leads to a different conductive type from that of the substrate 11. The dopant is generally Se or Si for an n-type layer and Zn or Mg for a p-type layer.

The thickness of the $Ga_xIn_{1-x}P$ contact layer 17 is not more than 1.0 μm, preferably about 0.1–0.7 μm, and more preferably about 0.3–0.6 μm. When the thickness of the $Ga_xIn_{1-x}P$ contact layer 17 exceeds 1.0 μm, the absolute amount of the interfacial distortion between the $Ga_xIn_{1-x}P$ contact layer 17 and the AlGaAs layer 16 becomes greater, placing a great load on the light emitting part A11. In view of the sufficient function as an electrode contact layer and easy formation of the contact layer, the thickness of the $Ga_xIn_{1-x}P$ contact layer 17 is appropriately not less than about 0.1 μm.

Examples of the materials for forming the upper electrode 18 and the lower electrode 19 include metallic materials such as AuBe and AuSn. The above-mentioned metallic materials are subjected to vacuum evaporation, photolithography and the like to give an electrode having a desired size and shape such as a dot and a strip. When the upper electrode is a dot electrode, the light emitted but blocked by the electrode can be reduced and high luminance of the emitted light is achieved.

Figure 2:
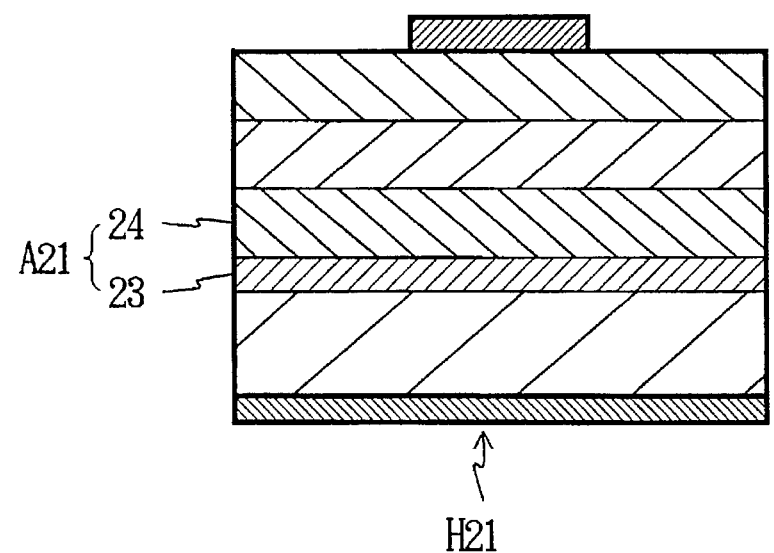
FIG. 2 is a sectional view of a light emitting diode showing another embodiment of the semiconductor light emitting element of the present invention.
Figure 3:
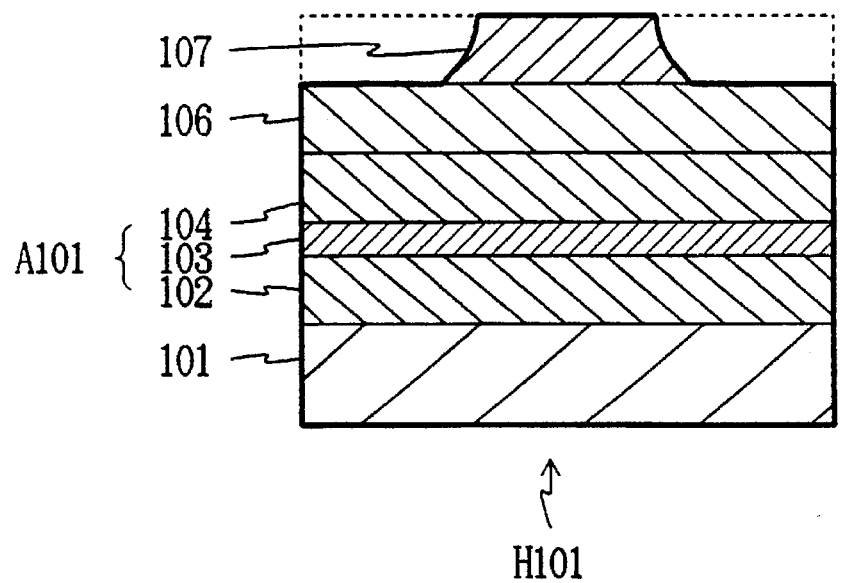
FIG. 3 is a sectional view showing one embodiment of a conventional semiconductor light emitting element.
Figure 4:
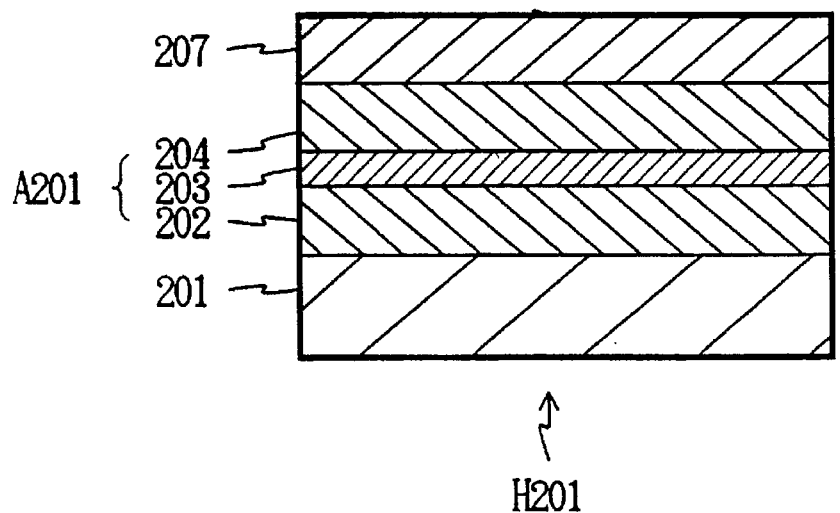
FIG. 4 is a sectional view showing another embodiment of a conventional semiconductor light emitting element.

In the above-mentioned FIG. 1, the light emitting part A11 has a double heterostructure (DH). As shown in FIG. 2, the light emitting part A21 having a single heterostructure (SH) can be also used in the present invention. In the light emitting element H21 as shown in FIG. 2, an n-type AlGaInP cladding layer is not formed and the light emitting part A21 consists of an AlGaInP active layer 23 and a p-type AlGaInP cladding layer 24 formed on said active layer 23. The rest of the light emitting element other than the light emitting part A21 is the same as that in the light emitting element H11 as shown in FIG. 1. The AlGaInP active layer 23 may have a quantum-well structure. When a high luminance light emission is desired, however, a light emitting part having a DH structure is more preferable than that having an SH structure.

The semiconductor light emitting element of the present invention having a double heterostructure as shown in FIG. 1 can be obtained by epitaxially growing an n-type AlGaInP cladding layer 12, an AlGaInP active layer 13, a p-type AlGaInP cladding layer 14, a p-type AlGaAs layer 16 and a p-type $Ga_xIn_{1-x}P$ contact layer 17 in order on an n-type GaAs substrate 11, and forming an upper electrode 18 on the surface of the aforementioned p-type $Ga_xIn_{1-x}P$ contact layer 17 and a lower electrode 19 under the n-type GaAs substrate 11.

For the crystal growth, a conventionally known film forming method capable of epitaxial growth of a semiconductor layer can be suitably used. Examples thereof are CVD method (chemical vapor deposition method), MOCVD method (metalorganic chemical vapor deposition), LPE method (liquid phase epitaxy method) and MBE method (molecular beam epitaxy method).

The present invention is described in more detail by way of the following Experimental Examples.

EXPERIMENTAL EXAMPLE 1

A light emitting diode H11 having the structure as shown in FIG. 1 was prepared by the following method. A 2 μm thick n-type AlGaInP cladding layer 12 (dopant: Se), a 0.5 μm thick AlGaInP active layer 13 and a 0.3 μm thick p-type AlGaInP cladding layer 14 (dopant: Zn) were sequentially formed on a 300 μm thick n-type GaAs substrate 11 (diameter 5 cm, dopant: Si) by the MOCVD method. Then, a 10 μm thick p-type AlGaAs layer 16 and a 0.5 μm thick p-type GaP contact layer 17 were epitaxially grown in order on the above-mentioned p-type AlGaInP cladding layer 14 by the same method as above.

The conditions for the epitaxial growth were growth temperature 700° C. and growth pressure 76 Torr. The gas flow amount during forming the respective layers was as follows. For AlGaInP cladding layer: trimethyl indium (TMI) 73 sccm, trimethyl aluminum (TMA) 3.6 sccm, trimethyl gallium (TMG) 1.2 sccm and PH$_3$ 400 sccm (n-type: H$_2$Se 17 sccm, p-type: dimethyl zinc (DMZ) 52 sccm). For AlGaInP active layer: TMI 73 sccm, TMA 1.4 sccm, TMG 2.8 sccm and PH$_3$ 445 sccm. For p-type AlGaAs layer: TMA 19.2 sccm, TMG 4.6 sccm, AsH$_3$ 550 sccm and DMZ 225 sccm. For p-type GaP layer: TMG 9.4 sccm, PH$_3$ 244 sccm and DMZ 214 sccm.

A dot AuBe upper electrode 18 was formed on the surface of the p-type GaP layer 17, and a plate AuSn lower electrode 19 was formed under the n-type GaAs substrate 11 by vacuum evaporation and photolithography, respectively.

COMPARATIVE EXPERIMENTAL EXAMPLE 1

In the same manner as in Experimental Example 1 except that a 0.5 µm thick p-type GaAs contact layer was formed instead of the p-type GaP contact layer 17 and a portion of said p-type GaAs contact layer other than the portion right beneath the electrode was removed by selective etching, a light emitting diode was manufactured.

COMPARATIVE EXPERIMENTAL EXAMPLE 2

In the same manner as in Experimental Example 1 except that a 10 µm thick p-type GaP contact layer was formed instead of the p-type AlGaAs layer 16 and the p-type GaP contact layer 17, a light emitting diode was manufactured.

PROPERTY TEST

A current (20 mA) was flown between the upper electrode and the lower electrode of each light emitting diode manufactured in the above Experimental Example 1 and Comparative Experimental Examples 1 and 2, to allow emission of the light, and the luminance was measured. In addition, the luminance was measured after continuous emission of the light for 2,000 hours at 85° C. under 85% humidity, and the life of the light emitting diode was evaluated based on the ratio of the decrease in luminance to the initial luminance. The life was evaluated according to the criteria of ○: ratio of decrease in luminance being less than 5%; Δ: ratio of decrease in luminance being 5–20%; and x: ratio of decrease in luminance being more than 20%. The results are shown in Table 1.

TABLE 1

|  | Exp. Ex. | Com. Exp. Ex. 1 | Com. Exp. Ex. 2 |
| --- | --- | --- | --- |
| luminance (mcd) | 30 | 28 | 28 |
| life evaluation | ○ | Δ | Δ |

As is evident from Table 1, the light emitting diode obtained in Experimental Example showed a luminance increase by a few percents in comparison with that obtained in the Comparative Experimental Examples. The light emitting diode obtained in Experimental Examples showed a greatly extended service life in comparison with those obtained in the Comparative Experimental Examples.

The structure of the semiconductor light emitting element of the present invention, comprising an AlGaAs layer and a Ga$_x$In$_{1-x}$P contact layer (0.7≦x≦1.0) sequentially deposited on a light emitting part comprising an AlGaInP active layer and an AlGaInP cladding layer, results in relaxation of the distortion caused by the different lattice constants and coefficients of thermal expansion by the buffer-like action of the AlGaAs layer, which in turn reduces the load applied to the light emitting part of the light emitting element, thereby greatly improving the efficiency of the light emission and the life of the light emitting element.

Moreover, the thin Ga$_x$In$_{1-x}$P contact layer having a thickness of not more than 1.0 µm reduces the absolute amount of the interfacial distortion between the contact layer and the AlGaAs layer, whereby also reducing the load on the light emitting part.

In addition, the use of a Ga$_x$In$_{1-x}$P layer which absorbs less emitted light, as an electrode contact layer, enables production of a light emitting element having a high light output efficiency, without removing the contact layer by etching. Accordingly, a light emitting element having a high luminance can be produced efficiently and the production cost can be markedly reduced.

What is claimed is:

1. A semiconductor light emitting element comprising a light emitting part comprising an AlGaInP active layer and an AlGaInP cladding layer, which is formed on a GaAs substrate, and an AlGaAs layer and a Ga$_x$In$_{1-x}$P layer (0.7≦x≦1.0) deposited in this order on said light emitting part, wherein said Ga$_x$In$_{1-x}$P layer has a thickness of not more than 1.0 µm.

2. The semiconductor light emitting element of claim 1, wherein the Ga$_x$In$_{1-x}$P layer is a GaP layer.

3. The semiconductor light emitting element of claim 1, wherein the thickness of the AlGaAs layer is 3–20 µm.

4. A semiconductor light emitting element comprising a first conductive type AlGaInP cladding layer, an AlGaInP active layer, a second conductive type AlGaInP cladding layer, a second conductive type AlGaAs layer and a second conductive type Ga$_x$In$_{1-x}$P layer (0.7≦x≦1.0) deposited in this order on a first conductive type GaAs substrate, wherein said Ga$_x$In$_{1-x}$P layer has a thickness of not more than 1.0 µm.

5. The semiconductor light emitting element of claim 4, wherein the Ga$_x$In$_{1-x}$P layer is a GaP layer.

6. The semiconductor light emitting element of claim 4, wherein the thickness of the AlGaAs layer is 3–20 µm.

7. A semiconductor light emitting element comprising an AlGaInP active layer, a second conductive type AlGaInP cladding layer, a second conductive type AlGaAs layer and a second conductive type Ga$_x$In$_{1-x}$P layer (0.7≦x≦1.0) deposited in this order on a first conductive type GaAs substrate, wherein said Ga$_x$In$_{1-x}$P layer has a thickness of not more than 1.0 µm.

8. The semiconductor light emitting element of claim 7, wherein the Ga$_x$In$_{1-x}$P layer is a GaP layer.

9. The semiconductor light emitting element of claim 7, wherein the thickness of the AlGaAs layer is 3–20 µm.

* * * * *